United States Patent
Li et al.

(10) Patent No.: US 12,101,892 B2
(45) Date of Patent: Sep. 24, 2024

(54) SEMI-AUTOMATIC CORROSION BOX OF COPPER CLAD LAMINATE

(71) Applicant: DALIAN UNIVERSITY OF TECHNOLOGY, Liaoning (CN)

(72) Inventors: Shengming Li, Liaoning (CN); Sen Qiu, Liaoning (CN); Fangyuan Hu, Liaoning (CN); Huihui Wang, Liaoning (CN)

(73) Assignee: DALIAN UNIVERSITY OF TECHNOLOGY, Liaoning (CN)

( * ) Notice: Subject to any disclaimer, the term of this patent is extended or adjusted under 35 U.S.C. 154(b) by 932 days.

(21) Appl. No.: 16/962,729

(22) PCT Filed: Nov. 13, 2019

(86) PCT No.: PCT/CN2019/118042
§ 371 (c)(1),
(2) Date: Jul. 16, 2020

(87) PCT Pub. No.: WO2020/125279
PCT Pub. Date: Jun. 25, 2020

(65) Prior Publication Data
US 2020/0359505 A1    Nov. 12, 2020

(30) Foreign Application Priority Data

Dec. 17, 2018 (CN) .......................... 201811543522.0

(51) Int. Cl.
*H05K 7/20* (2006.01)
*B32B 15/20* (2006.01)
*H05K 3/06* (2006.01)

(52) U.S. Cl.
CPC ............ *H05K 3/068* (2013.01); *B32B 15/20* (2013.01); *H05K 7/20272* (2013.01);
(Continued)

(58) Field of Classification Search
None
See application file for complete search history.

(56) References Cited

U.S. PATENT DOCUMENTS 5,141,602 A * 8/1992 Chen ...................... H01L 21/485
                                              204/230.6
10,096,501 B2 * 10/2018 Inoshima ................ H01L 22/26
(Continued)

FOREIGN PATENT DOCUMENTS

CN      202450160 U  *  9/2012
CN      103327747 A      9/2013
(Continued)

*Primary Examiner* — Courtney L Smith
(74) *Attorney, Agent, or Firm* — MUNCY, GEISSLER, OLDS & LOWE, P.C.

(57) ABSTRACT

A semi-automatic corrosion box of a copper clad laminate is disclosed. The corrosion device comprises a box body which has no cover; a baffle plate which divides the corrosion box into an upper part and a lower part, wherein a copper clad laminate circuit board is placed on the baffle plate, and a temperature detection module, water pumps and a heating rod are placed on a lower part; and a thermal imaging camera which is placed on a pressing plate through a bracket. Modules in corrosive liquid are connected with an external single chip microcomputer control module through corrosion-resistant wires. The working mode of the present invention is that time and temperature are set with a key matrix at first, and the control module can automatically stop working and enter a low power consumption mode.

1 Claim, 2 Drawing Sheets

(52) U.S. Cl.
CPC ............. *H05K 2203/0165* (2013.01); *H05K 2203/075* (2013.01); *H05K 2203/1105* (2013.01)

(56) References Cited

U.S. PATENT DOCUMENTS

| | | | | |
|---|---|---|---|---|
| 2013/0019904 A1 | * | 1/2013 | Becker | H05K 3/0085 |
| | | | | 134/195 |
| 2014/0036427 A1 | * | 2/2014 | Taniguro | B23K 3/0669 |
| | | | | 361/679.01 |
| 2016/0211157 A1 | * | 7/2016 | Inoshima | H01L 21/68757 |
| 2018/0265294 A1 | * | 9/2018 | Hayashi | H01L 21/67775 |

FOREIGN PATENT DOCUMENTS

| | | | | | |
|---|---|---|---|---|---|
| CN | 203313530 U | * | 11/2013 | | |
| CN | 103150956 B | * | 2/2015 | | |
| CN | 105256314 A | | 1/2016 | | |
| CN | 109587962 A | * | 4/2019 | ............. | B32B 15/20 |
| CN | 209462727 U | * | 10/2019 | ............. | B32B 15/20 |
| JP | 2015020102 A | | 2/2015 | | |

* cited by examiner

SEMI-AUTOMATIC CORROSION BOX OF COPPER CLAD LAMINATE

TECHNICAL FIELD

The present invention relates to a device for corroding a copper clad laminate, and particularly relates to a novel semi-automatic corrosion device of a copper clad laminate.

BACKGROUND

At present, most electronic laboratories used in major universities use a thermal transfer method to make circuit boards. A copper clad laminate is corroded to form a designed circuit board. A corrosion box device used to corrode the copper clad laminate has no heating function and fewer corrosion locations, and thus has the phenomena of overlong corrosion time and inadequate corrosion. A user wastes a lot of time in a waiting process. In addition, although the device uses a water pump and flushes the circuit board with corrosive liquid, a switch of the water pump still uses a plug of manual plugging, which is cumbersome and unsafe. In addition, the corrosive liquid is easy to splash out, which is easy to harm production personnel and pollute the environment.

The current corrosion device directly puts the copper clad laminate into the corrosive liquid. Although a heating mode is adopted, flushing with the corrosive liquid is lacked and the processing time is long. Moreover, the heating needs to be manually controlled, which is easy to cause the phenomenon of heating when no circuit board is corroded due to the negligence of the production personnel, resulting in waste of resources.

SUMMARY

In order to overcome the defects of dependence on manual operation and low corrosion efficiency in the existing corrosion device, the present invention provides a novel semi-automatic corrosion box.

The technical solution of the present invention is:

A semi-automatic corrosion device of a copper clad laminate comprises a corrosive box, a water pump flushing part, a heating part, a temperature display part, a control part and a processing part.

The corrosion box comprises a box body 1, a baffle plate 2 and a pressing plate 6; the box body 1 is divided by the baffle plate 2 into an upper part and a lower part; and the lower part has a small volume for storing a heating rod 8, a temperature detection module and corrosive liquid; a copper clad laminate is placed on the baffle plate 2; one end of the baffle plate 2 is a protruding one-piece uncovered rectangular container, and is connected with three water pumps 4; the water pumps 4 face upwards, and the function of uniformly flushing the copper clad laminate with the corrosive liquid is realized by control; a flushing path is a lower part of the corrosion box-the water pumps-an upper part of the corrosion box-the lower part of the corrosion box; and the pressing plate 6 is located above the uncovered rectangular container, and can be folded on the corrosion box to prevent the corrosive liquid from being sprayed out of the corrosion box.

The water pump flushing part is divided into three relays and three water pumps 4; The three relays are placed outside the corrosion box, and is connected with the three water pumps 4 at the lower part of the corrosion box through lines to achieve uniform flushing of the corrosive liquid, and the corrosive liquid covers the copper clad laminate to a certain height.

The heating part is a DC 24V, 100 w etch-resistant heating rod 8; the heating rod 8 is placed on the lower part of the corrosion box; and the activity of the heated corrosive liquid is increased, and the corrosion efficiency is greatly increased.

The temperature display part is mainly composed of an ink screen, a thermal imaging camera 5 and a waterproof temperature sensor 3; the ink screen and a processor are placed together; the waterproof temperature sensor 3 is placed below the corrosion box, and connected with the processor through a corrosion-resistant wire; the thermal imaging camera 5 is placed on the pressing plate 6; the temperature is detected by the non-contact thermal imaging camera 5 and the contact temperature sensor 3; the processor displays the temperature on the ink screen; and the temperature display is used to confirm whether the temperature is increased to a set value, and control the heating part.

The control part is mainly composed of a key matrix and the ink screen; and a display screen displays the content, and keys are used to select states to realize the function of controlling the temperature and the heating time.

The processing part is composed of a single chip computer, an LED display, a buzzer and a corresponding bottom plate; the bottom plate provides sockets for the single chip computer, the ink screen and the relays for convenient control; the part is placed outside the corrosion box and controls various internal parts through connecting lines; the LED and the buzzer are used for indicating corrosion states.

The beneficial effects of the present invention are as follows: while the water temperature and the flushing amount are controlled, the water pumps can be automatically cut off and heating can be stopped, so as to achieve low power consumption in a waiting process.

1. The water pumps are prevented from spraying out the corrosive liquid and injuring operators.
2. Corrosion temperature and time are automatically set, so as to increase the corrosion efficiency.
3. The flushing amount and flushing speed of the corrosive liquid can be set.
4. The power consumption in the corrosion process is reduced.

In the figures: 1 box body; 2 baffle plate; 3 temperature sensor; 4 water pump; 5 thermal imaging camera; 6 pressing plate; 7 thermal imaging camera bracket; 8 heating rod; 9 copper clad laminate; 10 relay; 11 ink screen; 12 key matrix; 13 display screen; 14 single chip microcomputer; 15 LED; 16 buzzer; 17 water pump flushing part; 18 heating part; 19 temperature display part; 20 control part.

DETAILED DESCRIPTION

Specific embodiments of the present invention are further described below in combination with accompanying drawings and the technical solution.

Figure 1:
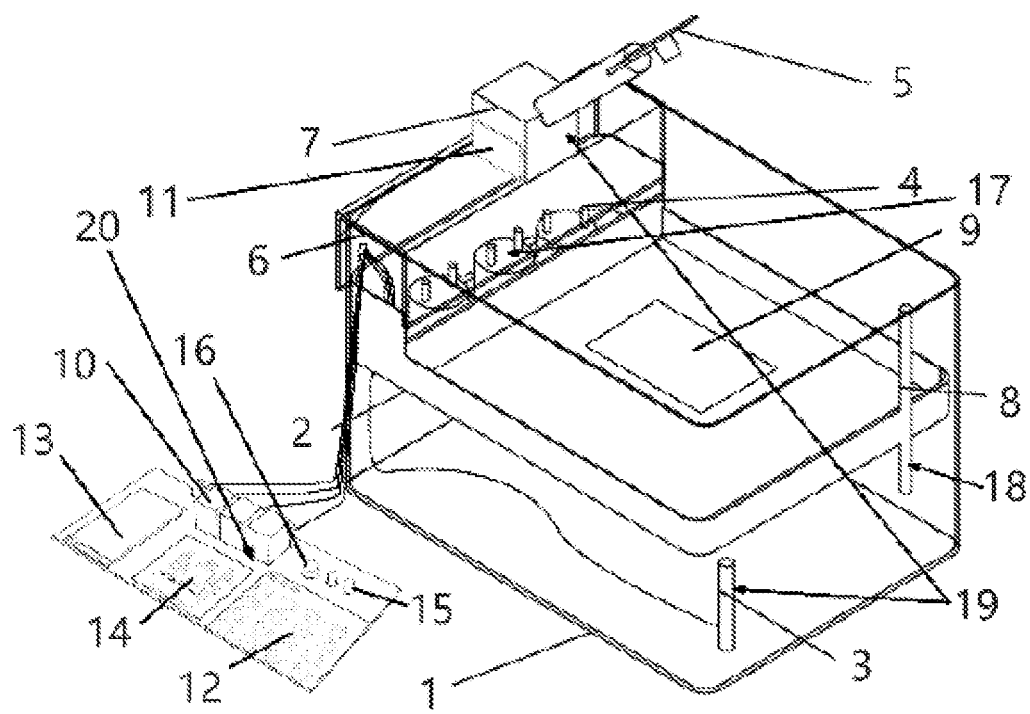
FIG. 1 is a structural schematic diagram of a corrosion device.

In an embodiment shown in FIG. 1, the interior of a box body 1 is wide at the top and narrow at the bottom, and a baffle plate 2 is just in the middle, and can be taken out upwards. Three water pumps 4 are placed in three round holes of the baffle plate 2. A pressing plate 6 is directly above the water pumps 4 to prevent the water pumps 4 from splashing corrosive liquid. A thermal imaging camera bracket 7 is placed on the pressing plate 6, and a thermal imaging camera 5 is fixed to the end of the bracket. A heating rod 8 is located between the box body 1 and the baffle plate 2. A temperature sensor 3 is placed on the lower part of the box body 1. The corrosive liquid located in the lower part of the box body 1 is sucked onto the baffle plate 6 by the water pumps in the baffle plate 6, and covers the circuit board to a certain thickness to fully corrode the circuit board.

Figure 2:
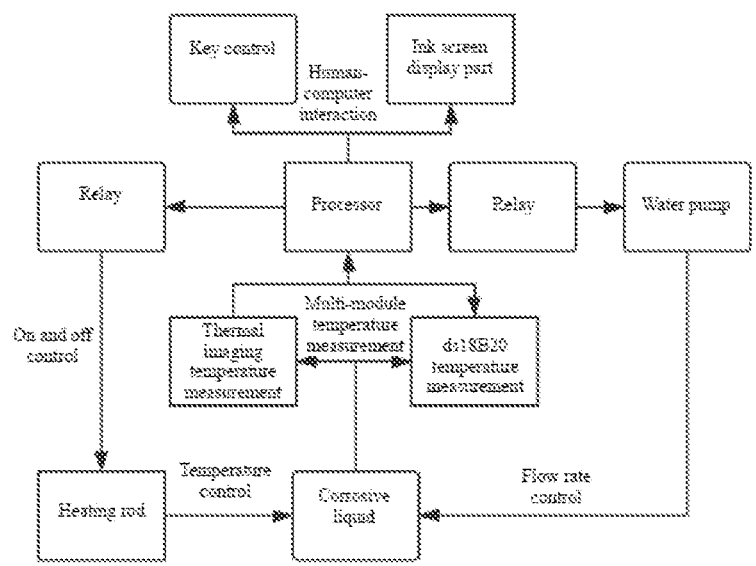
FIG. 2 is a flow chart of a main procedure in a semi-automatic corrosion device of a copper clad laminate in an embodiment.

As shown in FIG. 2, a control circuit part of the corrosion device comprises:

a single chip microcomputer 14 module which, as the core of an overall system, controls each part to realize functions;

a matrix keyboard module for conducting human-computer interaction and setting various system parameters;

an ink screen 11 for conducting human-computer interaction and displaying various system parameters at low power consumption;

relays 10 for controlling the heating rod and the water pumps;

a thermal imaging module for contactless temperature measurement;

a temperature sensor which is ds18B20 and conducts contact temperature detection.

The single chip microcomputer 14 is connected with the matrix keyboard module, the ink screen 11, the relays 10, the thermal imaging module and the temperature sensor, and the relays 10 are connected with the water pumps.

The single chip microcomputer 14 module uses a MSP430F5529 single chip microcomputer 14, and a minimum system of the single chip microcomputer 14 is composed of a MSP430F5529 chip and a corresponding topology circuit.

Figure 3:
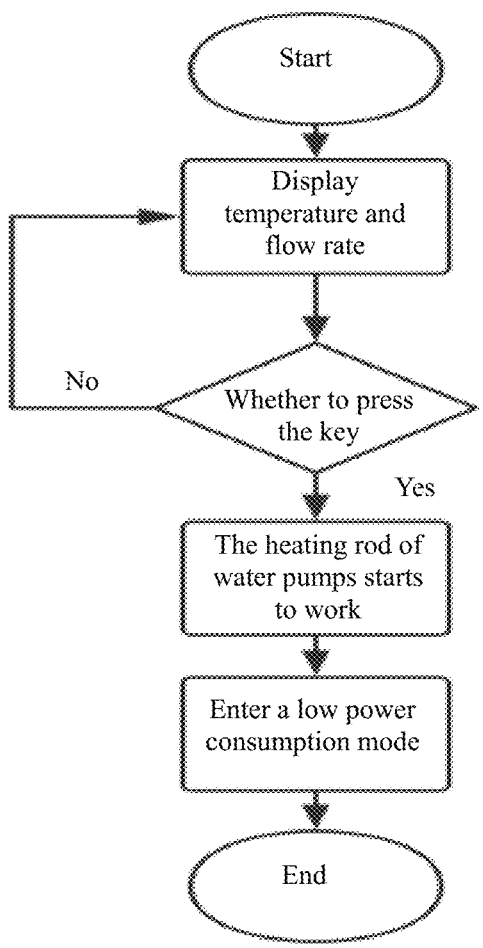
FIG. 3 is a structural block diagram in a semi-automatic corrosion device of a copper clad laminate in an embodiment.

As shown in FIG. 3, the flow of the main procedure of the system is as follows: the system is powered on; the single chip microcomputer 14 is initialized; the ink screen 11 reminds the key to input parameters; if there is no input, the ink screen 11 displays the reminder all the time; and if there is a key input, the heating temperature and the number of on and off of the water pumps are set according to the input parameters. When the set time is reached, the single chip microcomputer 14 stops the work of all modules and enters a low power consumption mode. The display screen 13 displays the parameters, to wait for waking up again.

As shown in FIG. 1, FIG. 2, and FIG. 3, when the present invention is used, firstly, the corrosive liquid is added to fill the lower part of the corrosion box; and then human-computer interaction is conducted and parameters such as corrosion time, temperature and flow rate are set. A start key is pressed, and the corrosion box automatically starts to work. The heating rod starts to heat to increase the corrosion speed. The water pumps also start to circulate the corrosive liquid to flush the circuit board. When the single chip microcomputer 14 module detects that the time reaches a set value, the heating rod of the single chip microcomputer 14 stops heating and the water pumps stop working. An indicator lamp lights up and a buzzer 16 sounds, to prompt that the corrosion is completed. Then, the single chip microcomputer 14 enters the low power consumption mode, and waits for waking up again.

The invention claimed is:

1. A semi-automatic corrosion device of a copper clad laminate, comprising a corrosion box, a water pump flushing part, a heating part, a temperature display part, a control part and a processing part, wherein the corrosion box comprises a box body, a baffle plate and a pressing plate; the box body is divided by the baffle plate into an upper part and a lower part; and the lower part has a small volume for storing a heating rod, a temperature detection module and corrosive liquid; a copper clad laminate is placed on the baffle plate; one end of the baffle plate is a protruding one-piece uncovered rectangular container, and is connected with three water pumps; the water pumps face upwards, and the function of uniformly flushing the copper clad laminate with the corrosive liquid is realized by control; a flushing part is defined by the lower part of the corrosion box, the water pumps and the upper part of the corrosion box; and the pressing plate is located above the uncovered rectangular container, and can be folded on the corrosion box to prevent the corrosive liquid from being sprayed out of the corrosion box;

the water pump flushing part is divided into three relays and three water pumps; the three relays are placed outside the corrosion box, and is connected with the three water pumps at the lower part of the corrosion box through lines to achieve uniform flushing of the corrosive liquid, and the corrosive liquid covers the copper clad laminate to a certain height;

the heating part is a DC 24V, 100 w etch-resistant heating rod; the heating rod is placed on the lower part of the corrosion box; and the activity of the heated corrosive liquid is increased, and the corrosion efficiency is greatly increased;

the temperature display part is mainly composed of an ink screen, a thermal imaging camera and a waterproof temperature sensor; the ink screen and a processor of the processing part are placed together; the waterproof temperature sensor is placed below the corrosion box, and connected with the processor through a corrosion-resistant wire; the thermal imaging camera is placed on the pressing plate; the temperature is detected by the non-contact thermal imaging camera and the contact temperature sensor; the processor provides a temperature signal to the ink screen; and the temperature display is used to confirm whether the temperature is increased to a set value, and control the heating part;

the control part is mainly composed of a key matrix and a display ink screen; and the display screen displays the content, and keys are used to select states to realize the function of controlling the temperature and the heating time;

the processing part is composed of the processor, an LED display, a buzzer and a corresponding bottom plate; the bottom plate provides sockets for the processor, the ink screen and the relays for convenient control; the processing part is placed outside the corrosion box and controls the water pump flushing part, the heating part, the temperature display part, the control part; the LED and the buzzer are used for indicating corrosion states.

\* \* \* \* \*